US012707856B2

(12) United States Patent
Yan

(10) Patent No.: US 12,707,856 B2
(45) Date of Patent: Aug. 11, 2026

(54) DISPLAY PANE AND ELECTRONIC DEVICE HAVING A METAL INHIBITION LAYER OVER LIGHT-SENSING SENOR

(71) Applicant: WUHAN CHINA STAR OPTOELECTRONICS SEMICONDUCTOR DISPLAY TECHNOLOGY CO., LTD., Wuhan (CN)

(72) Inventor: Yuan Yan, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 386 days.

(21) Appl. No.: 18/288,926

(22) PCT Filed: Jun. 30, 2023

(86) PCT No.: PCT/CN2023/104432

§ 371 (c)(1),
(2) Date: Oct. 30, 2023

(87) PCT Pub. No.: WO2024/124869

PCT Pub. Date: Jun. 20, 2024

(65) Prior Publication Data

US 2025/0081801 A1 Mar. 6, 2025

(30) Foreign Application Priority Data

Dec. 13, 2022 (CN) ......................... 202211614536.3

(51) Int. Cl.
*H10K 59/65* (2023.01)
*H10K 59/122* (2023.01)
(Continued)

(52) U.S. Cl.
CPC ........... *H10K 59/65* (2023.02); *H10K 59/122* (2023.02); *H10K 59/40* (2023.02);
(Continued)

(58) Field of Classification Search
CPC ...... G06V 40/13; H10K 50/30; H10K 50/805; H10K 50/844; H10K 50/858;
(Continued)

(56) References Cited

U.S. PATENT DOCUMENTS

2021/0202621 A1* 7/2021 Liang .................. H10K 59/124

FOREIGN PATENT DOCUMENTS

CN 109886140 A 6/2019
CN 110047902 A 7/2019
(Continued)

OTHER PUBLICATIONS

PCT International Search Report for International Application No. PCT/CN2023/104432, mailed on Sep. 11, 2023, 9pp.
(Continued)

*Primary Examiner* — Cheung Lee
(74) *Attorney, Agent, or Firm* — The Roy Gross Law Firm, LLC; Roy D. Gross

(57) ABSTRACT

The present disclosure provides a display panel and an electronic device. A pixel definition layer of the display panel is provided with multiple second openings corresponding to multiple light-sensing sensors, a metal inhibition layer of the display panel is laid in the multiple second openings, and a encapsulation layer of the display panel is disposed to cover the metal inhibition layer and fill into the multiple second openings. By providing the multiple second openings on the pixel definition layer, lights are capable of passing through the pixel definition layer to reach the multiple light-sensing sensors, thereby solving a problem
(Continued)

that an existing under-screen optical fingerprint is difficult to be directly applied in OLED products.

20 Claims, 7 Drawing Sheets

(51) Int. Cl.
*H10K 59/40* (2023.01)
*H10K 59/80* (2023.01)
*H10K 59/38* (2023.01)

(52) U.S. Cl.
CPC . *H10K 59/80521* (2023.02); *H10K 59/80524* (2023.02); *H10K 59/873* (2023.02); *H10K 59/38* (2023.02)

(58) Field of Classification Search
CPC .... H10K 50/865; H10K 59/00; H10K 59/122; H10K 59/126; H10K 59/38; H10K 59/40; H10K 59/65; H10K 59/805; H10K 59/80521; H10K 59/80524; H10K 59/873; H10K 59/8731; H10K 59/879; H10K 59/8792
See application file for complete search history.

(56) References Cited

FOREIGN PATENT DOCUMENTS

| | | | |
|---|---|---|---|
| CN | 110061041 | A | 7/2019 |
| CN | 110826373 | A | 2/2020 |
| CN | 111599846 | A | 8/2020 |
| CN | 111785854 | A | 10/2020 |
| CN | 112861651 | A | 5/2021 |
| CN | 112928147 | A | 6/2021 |
| CN | 116018018 | A | 4/2023 |

OTHER PUBLICATIONS

PCT Written Opinion of the International Searching Authority for International Application No. PCT/CN2023/104432, mailed on Sep. 11, 2023, 9pp.
Chinese Office Action issued in corresponding Chinese Patent Application No. 202211614536.3 dated Jun. 28, 2025, pp. 1-7.

* cited by examiner

DISPLAY PANE AND ELECTRONIC DEVICE HAVING A METAL INHIBITION LAYER OVER LIGHT-SENSING SENOR

CROSS REFERENCE TO RELATED APPLICATIONS

This application is a National Phase of PCT Patent Application No. PCT/CN2023/104432 having International filing date of Jun. 30, 2023, which claims the benefit of priority of Chinese Patent Application No. 202211614536.3, filed Dec. 13, 2022, the contents of which are all incorporated herein by reference in their entirety.

TECHNICAL FIELD

The present disclosure relates to the field of display technologies, and more particularly, to a display panel and an electronic device.

BACKGROUND

With development of display technology, a variety of display devices with fingerprint recognition functions have come into market, such as mobile phones, tablets, and smart wearable devices. Common fingerprint recognition methods mainly include under-screen optical fingerprint recognition and under-screen ultrasonic fingerprint recognition, in which the under-screen optical fingerprint recognition has become the mainstream of the market due to its price advantage. When the under-screen optical fingerprint recognition is applied to organic light-emitting diode (OLED) display devices, imaging effect of under-screen optical fingerprint is affected by poor light transmission of a pixel definition layer, thereby resulting in making the under-screen optical fingerprint difficult to be directly applied in OLED products.

Technical Problems

The present disclosure provides a display panel and an electronic device, which can effectively solve the problems that the under-screen optical fingerprint is difficult to be directly applied in the OLED products in the related art.

Technical Solutions

In order to solve the above problems, technical solutions provided in the present disclosure are as follows.

An embodiment of the present disclosure provides a display panel, including:

- a substrate;
- a driving circuit layer disposed on a side of the substrate and including: both multiple pixel driving circuits and multiple light-sensing sensors disposed between adjacent pixel driving circuits of the multiple pixel driving circuits;
- a first electrode layer disposed on a side of the driving circuit layer away from the substrate and including: multiple first electrodes, where each of the multiple first electrodes is electrically connected to corresponding one of the multiple pixel driving circuits;
- a pixel definition layer disposed on a side of the first electrode layer away from the substrate and including both multiple first openings corresponding to the multiple first electrodes and multiple second openings corresponding to the multiple light-sensing sensors;

- a light emitting layer disposed on a side of the pixel definition layer away from the substrate;
- a second electrode layer, disposed on a side of the light emitting layer away from the substrate and including a plurality of third openings corresponding to the plurality of second openings;
- a metal inhibition layer corresponding to the plurality of third openings and laid in the plurality of second openings; and
- an encapsulation layer disposed on a side of the second electrode layer away from the substrate and disposed to cover the metal inhibition layer and fill into the plurality of second openings;
- where, a refractive index of the encapsulation layer is greater than that of the metal inhibition layer.

In the display panel provided by the embodiment of the present disclosure, an included angle between a side wall of each of the plurality of second openings and a bottom surface of the second opening close to the substrate is greater than 90 degrees; and the metal inhibition layer is disposed to at least cover the side wall of each of the plurality of second openings.

In the display panel provided by the embodiment of the present disclosure, the encapsulation layer includes a first inorganic encapsulation sublayer, an organic encapsulation sublayer, and a second inorganic encapsulation sublayer stacked in sequence; and the first inorganic encapsulation sublayer is in contact with a side surface of the metal inhibition layer away from the substrate, and a refractive index of the first inorganic encapsulation sublayer is greater than the refractive index of the metal inhibition layer.

In the display panel provided by an embodiment of the present disclosure, the display panel further includes: a color light filter layer disposed on a side of the encapsulation layer away from the substrate, where the color light filter layer includes: a light-shielding portion, including a plurality of fourth openings corresponding to the plurality of first openings and a plurality of fifth openings corresponding to the plurality of second openings; and light filter portions corresponding to the plurality of fourth openings.

In the display panel provided by the embodiment of the present disclosure, the pixel definition layer includes black pixels, a shape of each of the plurality of second openings is the same as a shape of each of the plurality of fifth openings, and a size of each of the plurality of second openings is the same as a size of each of the plurality of fifth openings.

In the display panel provided by the embodiment of the present disclosure, a shape of a bottom surface of each of the plurality of second openings close to the substrate is the same as a shape of a bottom surface of each of the plurality of fifth openings close to the substrate, and a size of the bottom surface of the second opening close to the substrate is the same as a size of the bottom surface of the fifth opening close to the substrate.

In the display panel provided by an embodiment of the present disclosure, the display panel further includes: a touch layer disposed on a side of the encapsulation layer away from the substrate and including a touch electrode sublayer, where the touch electrode sublayer includes a plurality of sixth openings corresponding to the plurality of second openings.

In the display panel provided by the embodiment of the present disclosure, a shape of each of the plurality of second openings is the same as a shape of each of the plurality of sixth openings, and a size of each of the plurality of second openings is smaller than or equal to a size of each of the plurality of sixth openings.

In the display panel provided by the embodiment of the present disclosure, a partial film layer of each of the plurality of light-sensing sensors is disposed at the same layer as that of the driving circuit layer.

Another embodiment of the present disclosure provides an electronic device including the display panel according to any one of the above embodiments.

Beneficial Effects

In the display panel and the electronic device provided by the present disclosure, the driving circuit layer of the display panel includes the multiple pixel driving circuits and the multiple light-sensing sensors disposed between the adjacent pixel driving circuits of the multiple pixel driving circuits; each of the multiple first electrodes is electrically connected to the corresponding pixel driving circuit; the pixel definition layer is provided the multiple first openings corresponding to the multiple first electrodes and the multiple second openings corresponding to the multiple light-sensing sensors; the second electrode layer is provided with the multiple third openings corresponding to the multiple second openings; the metal inhibition layer is disposed to correspond to the multiple third openings and laid in the multiple second openings; the encapsulation layer is disposed to cover the metal inhibition layer fill into the multiple second openings; and the refractive index of the encapsulation layer is greater than that of the metal inhibition layer. In the present disclosure, the multiple second openings provided on the pixel definition layer makes lights capable of transmitting the pixel definition layer to reach the multiple light-sensing sensors, which solves the problems that the under-screen optical fingerprint is difficult to be directly applied in the OLED products in the related art. Meanwhile, the metal inhibition layer with the lower refractive index is laid in the multiple second openings and cooperates with the encapsulation layer with the higher refractive index, thereby converging the lights reflected by a fingerprint towards a receiving surface of the multiple light-sensing sensors to increase the number of lights reaching thereon, and then clarity of the formed optical fingerprint imaging is improved, and accuracy of the optical fingerprint recognition is further improved.

BRIEF DESCRIPTION OF THE DRAWINGS

In order to illustrate technical solutions in embodiments of the present disclosure or in the related art clearly, the accompanying drawings involved in the description of the embodiments or the related art are described briefly below. It will be apparent that the accompanying drawings in the following description are merely some of the embodiments of the present disclosure, and based on these drawings, other drawings may be made to those skilled in the art without involving any inventive effort.

DETAILED DESCRIPTION OF THE EMBODIMENTS

Figure 1:
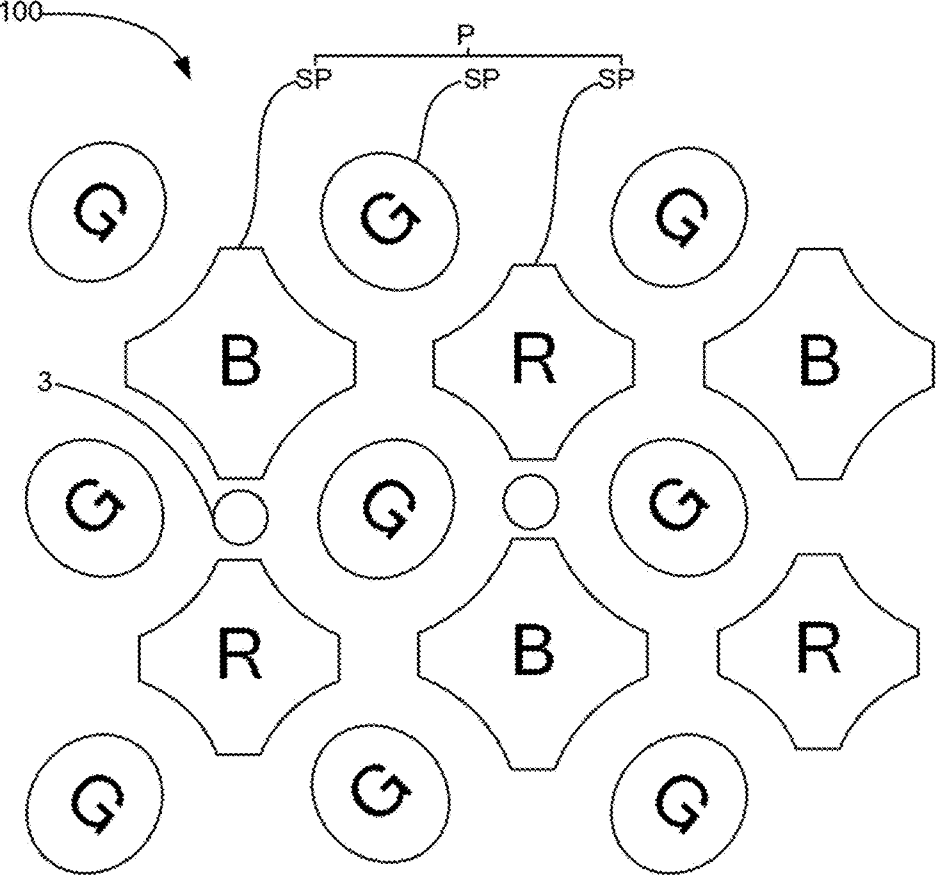
FIG. 1 is a schematic structural diagram of a top view of a display panel according to an embodiment of the present disclosure.

The following description for embodiments refers to attached illustrations to illustrate specific embodiments that may be implemented in the present disclosure. Directional terms mentioned in the present disclosure, such as "upper", "lower", "front", "back", "left", "right", "inner", "outer", "side edge", etc. are merely directions referring to the attached illustrations. Therefore, the used directional terms are used to illustrate and understand the present disclosure, but are not intended to limit the present disclosure. In the accompanying drawings, components with similar structures are represented by the same reference numeral. Moreover, in the accompanying drawings, thicknesses of some film layers and regions are exaggerated for clear understanding and ease of description. That is, the size and thickness of each component illustrated in the accompanying drawings are arbitrarily illustrated, but the present disclosure is not limited thereto.

Figure 2:
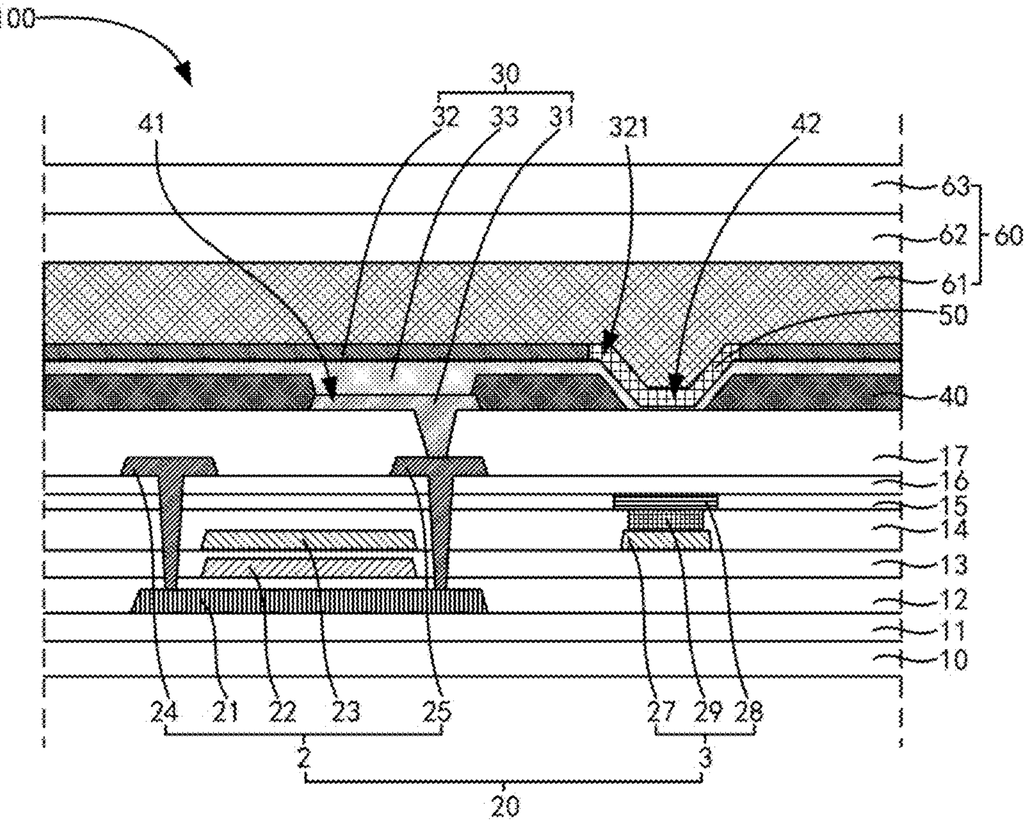
FIG. 2 is a schematic structural diagram of a cross-sectional view of the display panel according to the embodiment of the present disclosure.
Figure 3:
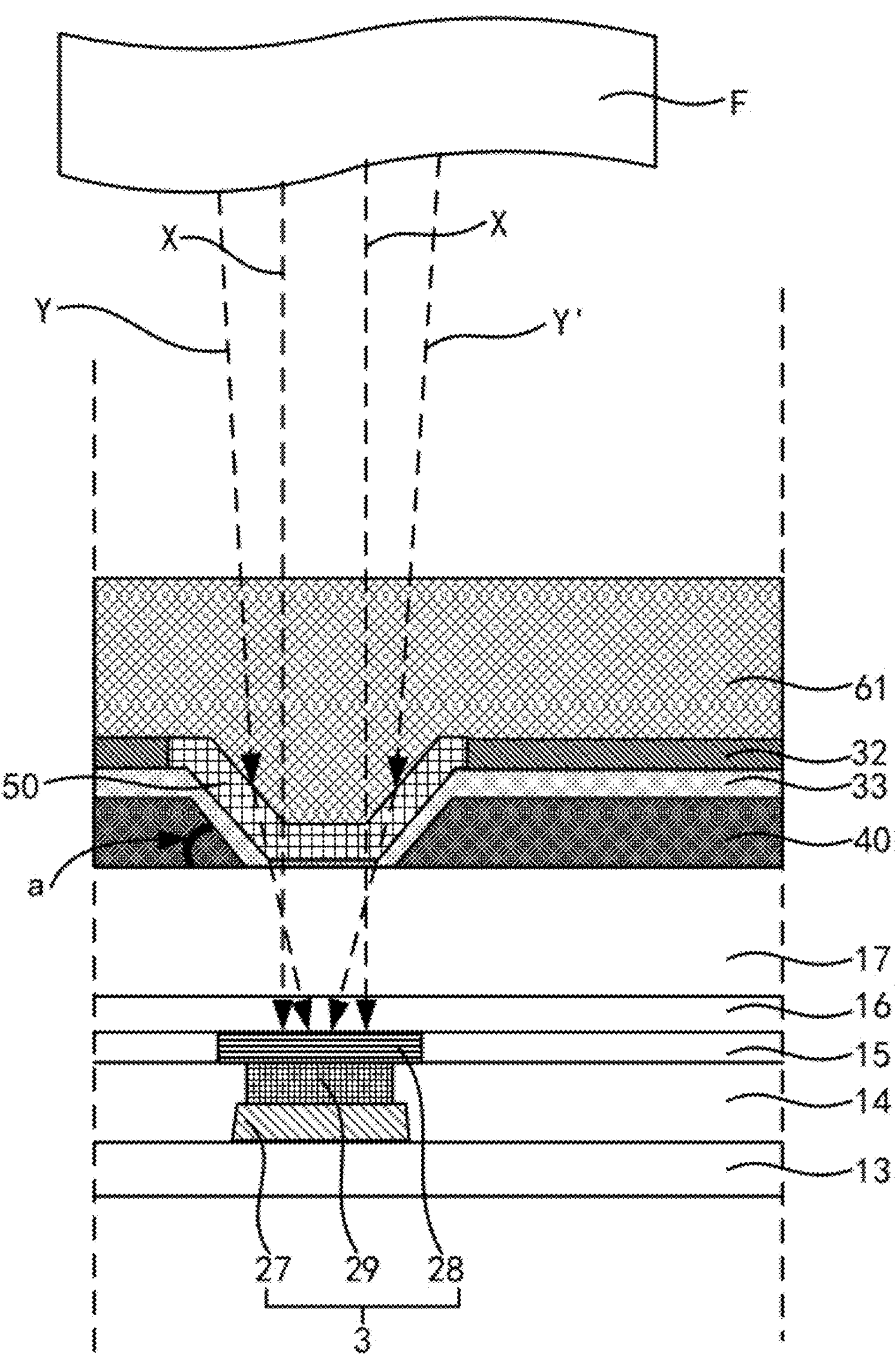
FIG. 3 is a schematic structural diagram of details of a second opening in FIG. 2.

With reference to FIG. 1 to FIG. 3, FIG. 1 is a schematic top view of a display panel according to an embodiment of the present disclosure; FIG. 2 is a schematic cross-sectional view of the display panel according to the embodiment of present disclosure; and FIG. 3 is a detailed schematic structural diagram of a second opening illustrated in FIG. 2. As shown in FIG. 1, the display panel 100 includes multiple sub-pixels SP arranged in an array and multiple light-sensing sensors 3 disposed between adjacent sub-pixels SP of the multiple sub-pixels SP. Specially, the multiple sub-pixels SP include multiple red sub-pixels R, multiple green sub-pixels G, and multiple blue sub-pixels B; the multiple red sub-pixels R are capable of emitting red lights, the green sub-pixels G are capable of emitting green lights, and the blue sub-pixels B are capable of emitting blue lights; and adjacent three sub-pixels SP with different colors (i.e., a red sub-pixel, a green sub-pixel, and a blue sub-pixel) form a pixel P.

There is an interval existed between the two adjacent sub-pixels SP, and one of the multiple light-sensing sensors 3 is disposed in the interval between the two adjacent sub-pixels SP, so as to integrate the light-sensing sensor 3 into the display panel 100 without affecting the normal display of the display panel 100. In this way, the multiple light-sensing sensors 3 are integrated into the display panel 100, so as to implement functions of fingerprint recognition, palmprint recognition, and distance detection of the display panel 100; and embodiments of the present disclosure are described by implementing the function of fingerprint recognition as an example. It may be understood that when the multiple light-sensing sensors 3 are integrated into the display panel 100 together, large-area fingerprint recognition or full-screen fingerprint recognition can be realized.

As shown in FIG. 2, the display panel 100 further includes a substrate 10 and a driving circuit layer 20 disposed on a side of the substrate 10; the driving circuit layer 20 includes multiple pixel driving circuits 2 and the multiple light-sensing sensors 3. Each sub-pixel SP includes at least one pixel driving circuit 2, and then each of the multiple light-sensing sensors 3 is disposed between adjacent pixel driving circuits 2 of the multiple pixel driving circuits 2. Moreover, positions of the multiple light-sensing sensors 3 in the present disclosure are not limited thereto, and the multiple light-sensing sensors 3 of the present disclosure may also be disposed on a side of the substrate 10 away from the multiple pixel driving circuits 2, but when the multiple light-sensing sensors 3 and the multiple pixel driving circuits 2 are disposed on a same side of the substrate 10, a thickness of the display panel 100 can be reduced.

Alternatively, the substrate 10 can be a rigid substrate or a flexible substrate; when the substrate 10 is determined as the rigid substrate, the substrate 10 can be a glass substrate; and when the substrate 10 is determined as the flexible substrate, the substrate 10 can be a polyimide (PI) film or an ultra-thin glass film. Furthermore, when the substrate 10 is determined as the flexible substrate, the display panel 100 can implement functions such as bending, curving, and folding.

With continued reference to FIG. 2, the pixel driving circuit 2 is disposed on the substrate 10. Alternatively, a buffer layer 11 can also be disposed between the pixel driving circuit 2 and the substrate 10, and the buffer layer 11 can be a silicon oxide film, a silicon nitride film, or multiple layers including the silicon oxide film and the silicon nitride film. The buffer layer 11 can prevent undesirable impurities or contaminants (e.g., moisture, oxygen, etc.) from diffusing from the substrate 10 to components (e.g., the pixel driving circuit 2, the light-sensing sensor 3, etc.) that may be damaged by these impurities or contaminants. Meanwhile, the buffer layer 11 can also be regarded as a planar top surface.

Each of the multiple pixel driving circuits 2 includes an active layer 21, a first gate 22, a second gate 23, a first source electrode 24, and a first drain electrode 25. In order to insulate multiple metallic layers (also referred as to layers that are provided with the active layer, the first gate, the second gate, the first source electrode, and the first drain electrode) in the pixel driving circuit 2 from each other, the display panel 100 further includes multiple insulation layers (i.e., a first gate insulation layer, a second gate insulation layer, etc.). Specifically, the active layer 21 is disposed on the buffer layer 11 and a first gate insulation layer 12 is disposed to cover the active layer 21 and the buffer layer 11; the first gate 22 is disposed on the first gate insulation layer 12, and a second gate insulation layer 13 is disposed to cover the first gate 22 and the first gate insulation layer 12; the second gate 23 is disposed on the second gate insulation layer 13; and then an interlayer insulation layer 14, a first passivation layer 15, and a second passivation layer 16 are stacked to be disposed to cover the second gate 23 and the second gate insulation layer 13.

The first gate 22 and the second gate 23 are disposed to correspond to channels of the active layer 21. The first gate 22 and the second gate 23 are made of metal materials; and the first gate insulation layer 12, the second gate insulation layer 13, the interlayer insulation layer 14, the first passivation layer 15, and the second passivation layer 16 are all made of inorganic materials, such as silicon oxide or silicon nitride.

The first source electrode 24 and the first drain electrode 25 are disposed on the second passivation layer 16, the first source electrode 24 is electrically connected to a source region disposed on an end of the channels of the active layer 21 and the first drain electrode 25 is electrically connected to a drain region disposed on another end of the channels of the active layer 21, namely, the source region and the drain region are disposed on two opposite ends of the channels. A first planarization layer 17 is disposed to cover the first source electrode 24, the first drain electrode 25, and the second passivation layer 16. The first source electrode 24 and the first drain electrode 25 are made of the metal materials, and the first planarization layer 17 is made of an organic material, so as to better planarize undulation of the pixel driving circuit 2 and provide a better flat surface.

Alternatively, a partial film layer of the multiple light-sensing sensors 3 and a partial film layer of the multiple pixel driving circuits 2 are disposed in a same layer, so that the multiple light-sensing sensors 3 and the multiple pixel driving circuits 2 are obtained under same production conditions, thereby simplifying production process. Specifically, each of the multiple light-sensing sensors 3 includes a bottom electrode 27, a top electrode 28, and an intrinsic semiconductor layer 29; and the intrinsic semiconductor layer 29 is disposed between the bottom electrode 27 and the top electrode 28. Moreover, the bottom electrode 27 and the second gate 23 are disposed at the same layer, but the present disclosure is not limited thereto; and the bottom electrode 27 can be disposed in a same layer as the other metallic layers of the pixel driving circuit 2, such as the first gate 22.

It should be noted that, "disposed at the same layer" in the present disclosure refers to that the film layers made of the same material is performed by patterning processing during the production process to obtain at least two different structures, so that the at least two different structures are disposed at the same layer. For example, the bottom electrode 27 and the second gate 23 in the present embodiment are obtained by patterning a film layer made of the same conductive material, and the bottom electrode 27 and the second gate 23 are disposed at the same layer.

The interlayer insulation layer 14 is provided with multiple first holes at positions corresponding to the multiple bottom electrodes 27, each of the multiple first holes exposes the corresponding bottom electrode 27, and each of the multiple intrinsic semiconductor layers 29 is filled into the corresponding first hole and is disposed to cover the corresponding bottom electrode 27. The first passivation layer 15 is provided with multiple second holes at positions corresponding to the multiple intrinsic semiconductor layers 29, each of the multiple second holes exposes the corresponding intrinsic semiconductor layer 29, and the corresponding top electrode 28 is filled into the second hole and is disposed to cover the corresponding intrinsic semiconductor layer 29. Specially, the top electrode 28 is made of transparent conductive materials, such as indium tin oxide (ITO).

Further, with continued reference to FIG. 2, the display panel 100 further includes a light emitting functional layer 30 disposed on a side of the driving circuit layer 20 away from the substrate 10. The light emitting functional layer 30 includes a first electrode layer, a second electrode layer 32, and a light emitting layer 33; and the light emitting layer 33 is disposed between the first electrode layer and the second electrode layer 32.

The first electrode layer is disposed on a side of the driving circuit layer 20 away from the substrate 10, the first electrode layer includes multiple first electrodes 31, and each of the multiple first electrodes 31 is electrically connected to the corresponding pixel driving circuit 2. Specifically, the first electrode 31 is disposed on the first planarization layer 17, and then is electrically connected to the corresponding first drain electrode 25 by a through hole of the first planarization layer 17, thereby to implement an electrical connection between the first electrode 31 and the corresponding pixel driving circuit 2. Moreover, the pixel driving circuit 2 is configured to provide a driving signal to the corresponding first electrode 31.

Further, the display panel 100 further includes a pixel definition layer 40, the pixel definition layer 40 is disposed on a side of the multiple first electrodes 31 away from the substrate 10 and is disposed to cover the multiple first electrodes 31 and the first planarization layer 17. The pixel definition layer 40 is provided with black pixels therein, so that the pixel definition layer 40 is capable of shielding the lights. The pixel definition layer 40 is provided with multiple first openings 41 corresponding to the multiple first electrodes 31 and multiple second openings 42 corresponding to the multiple light-sensing sensors 3. Each of the multiple first openings 41 exposes a portion of the corresponding first electrode 31. Each of the multiple second openings 42 can enable the lights to pass through the pixel definition layer 40 to reach the corresponding light-sensing sensor 3, thereby solving the problem that the under-screen optical fingerprint is difficult to be directly applied in the OLED product in the related art.

The light emitting layer 33 is disposed on a side of the pixel definition layer 40 away from the substrate 10 and is disposed to cover the pixel definition layer 40 and the multiple first electrodes 31 that are disposed in the multiple first openings 41. The second electrode layer 32 is disposed on a side of the light emitting layer 33 away from the substrate 10. The light emitting layer 33 emits the lights under the action of the second electrode 32 and the second electrode layer 32. The multiple first electrodes 31 are determined as an anode and the second electrode layer 32 is determined as a cathode. Alternatively, the light emitting layer 33 may further include an auxiliary functional layer, such as an organic functional layer like a hole-transport layer and an electron transport layer.

The second electrode layer 32 is provided with multiple third openings 321 corresponding to the multiple second openings 42. An aperture of each of the multiple third openings 321 is greater than or equal to an aperture of the corresponding second opening 42, so that an orthographic projection of the third opening 321 on the substrate 10 is capable of covering an orthographic projection of the second opening 42 on the substrate 10; and an orthographic projection area of the third opening 321 on the substrate 10 is greater than an orthographic projection area of the second opening 42 on the substrate 10, which prevents the second electrode layer 32 from blocking the second opening 42.

Further, the display panel 100 includes a metal inhibition layer 50 disposed to correspond to the multiple third openings 321. The metal inhibition layer 50 is laid in the multiple second openings 42. Alternatively, the metal inhibition layer 50 is made of an organic material with an oleophylic group, and the second electrode layer 32 is made of a mental material with a hydrophilic group.

Before the second electrode layer 32 is prepared, the metal inhibition layer 50 is evaporated at a position corresponding to the multiple light-sensing sensors 3 by means of evaporation and other processes, and then the second electrode layer 32 is deposited on the light emitting layer 33 all around. Moreover, the patterning is achieved by using the mutual repulsion effect between the second electrode layer 32 and the metal inhibition layer 50, so that the second electrode layer 32 is naturally disconnected at positions of the metal inhibition layer 50 to form the multiple third openings 321.

Further, the display panel 100 includes a encapsulation layer 60 disposed on a side of the light emitting functional layer 30 away from the driving circuit layer 20, and the encapsulation layer 60 is configured to protect the light emitting functional layer 30 from water and oxygen entering the light emitting layer 33 to cause loss of the light emitting layer 33. Specifically, the encapsulation layer 60 is disposed on a side of the second electrode layer 32 away from the substrate 10. The encapsulation layer 60 is further disposed to cover the second electrode layer 32 and the metal inhibition layer 50, and the metal inhibition layer 50 is further filled into the multiple second openings 42 and the multiple third openings 321; and a refractive index of the encapsulation layer 60 is greater than that of the metal inhibition layer 50.

Alternatively, the encapsulation layer 60 includes a first inorganic encapsulation sublayer 61, an organic encapsulation sublayer 62, and a second inorganic encapsulation sublayer 63 that are sequentially stacked. The first inorganic encapsulation sublayer 61 is in contact with a side surface of the metal inhibition layer 50 away from the substrate 10, the first inorganic encapsulation sublayer 61 is filled into the multiple second openings 42 and the multiple third openings 321, and a refractive index of the first inorganic encapsulation sublayer 61 is greater than that of the metal inhibition layer 50, so that the lights passing through the multiple second openings 42 are capable of converging. Alternatively, the refractive index of the first inorganic encapsulation sublayer 61 is 1.7, and the refractive index of the metal inhibition layer 50 is 1.4.

Specifically, with reference to FIG. 3, a slope angle of each of the multiple second openings 42 is greater than 90 degrees, so that the second opening 42 form a slope included between the second opening 42 and pixel definition layer 40, thereby making an included angle between a side wall of the second opening 42 and a bottom surface of the second opening 42 close to the substrate 10 is greater than 90 degrees. The metal inhibition layer 50 is at least disposed to cover the side wall of the second opening 42 and a side wall of the corresponding third opening 321. Therefore, a portion of the metal inhibition layer 50 disposed to cover the side wall of the second opening 42 also has a slope angle of less than 90 degrees.

It should be noted that the slope angle shown as a character "a" in FIG. 3 of the second opening 42 refers to the included angle between the side wall of the second opening 42 and a planar layer covered by the pixel definition layer 40, and the side wall of the second opening 42 refers to a surface exposed by the second opening 42 after the pixel definition layer 40 is provided with the second opening 42. The slope angle of the metal inhibition layer 50 refers to an included angle between a portion of the metal inhibition layer 50 disposed to cover the side wall of the second opening 42 and the planar layer covered by the pixel definition layer 40.

Further, when lights reflected by a fingerprint F passes through the first inorganic encapsulation sublayer 61 to reach interfaces (i.e., a first interface and a second interface) between the first inorganic encapsulation sublayer 61 and the metal inhibition layer 50, lights substantially perpendicular to the receiving surfaces of the multiple light-sensing sensors 3 can be received by the multiple light-sensing sensors 3, such as the lights X shown in FIG. 3; and the lights at other angles are refracted by the metal inhibition layer 50, such as the lights Y and Y' shown in FIG. 3. Moreover, since the refractive index of the first inorganic encapsulation sublayer 61 is greater than the refractive index of the metal inhibition layer 50, the lights refracted by the metal inhibition layer 50 converges to the receiving surfaces of the multiple light-sensing sensors 3, so as to increase the number of lights reaching the receiving surfaces of the multiple light-sensing sensors, thereby improving the clarity of the formed optical fingerprint imaging, and further improving the accuracy of the optical fingerprint recognition.

Figure 4:
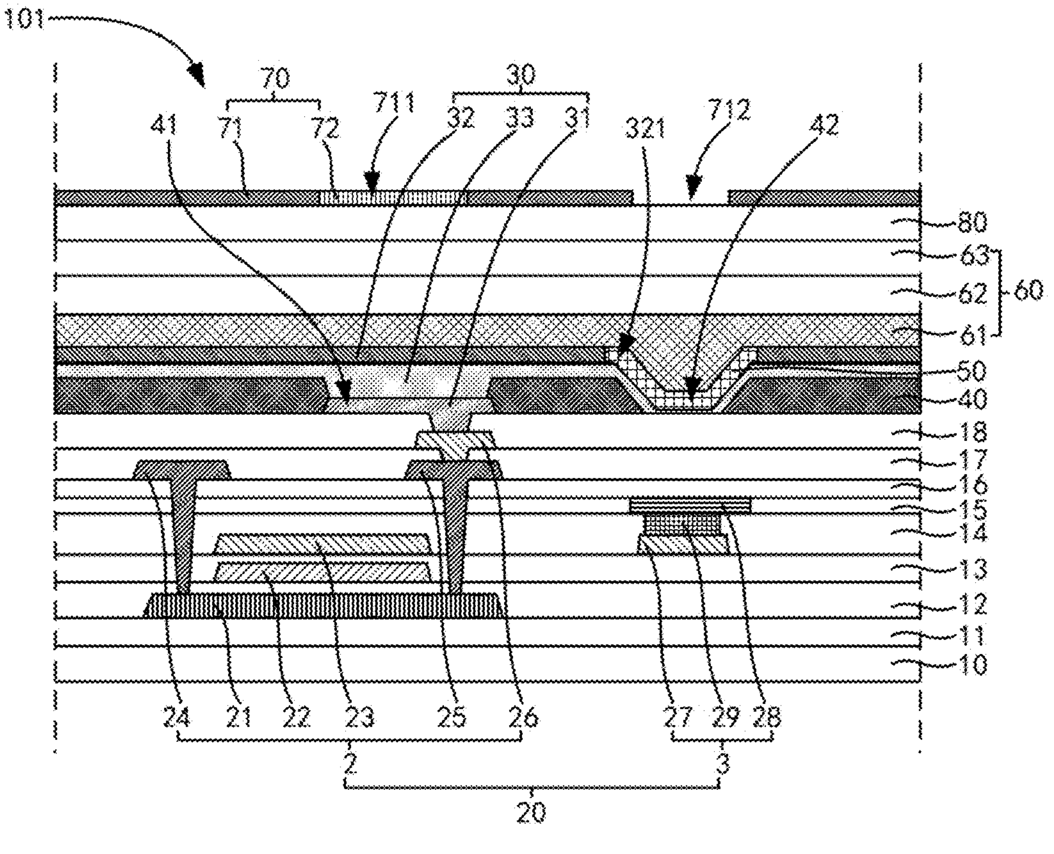
FIG. 4 is a schematic structural diagram of another cross-sectional view of a display panel according to an embodiment of the present disclosure.
Figure 5:
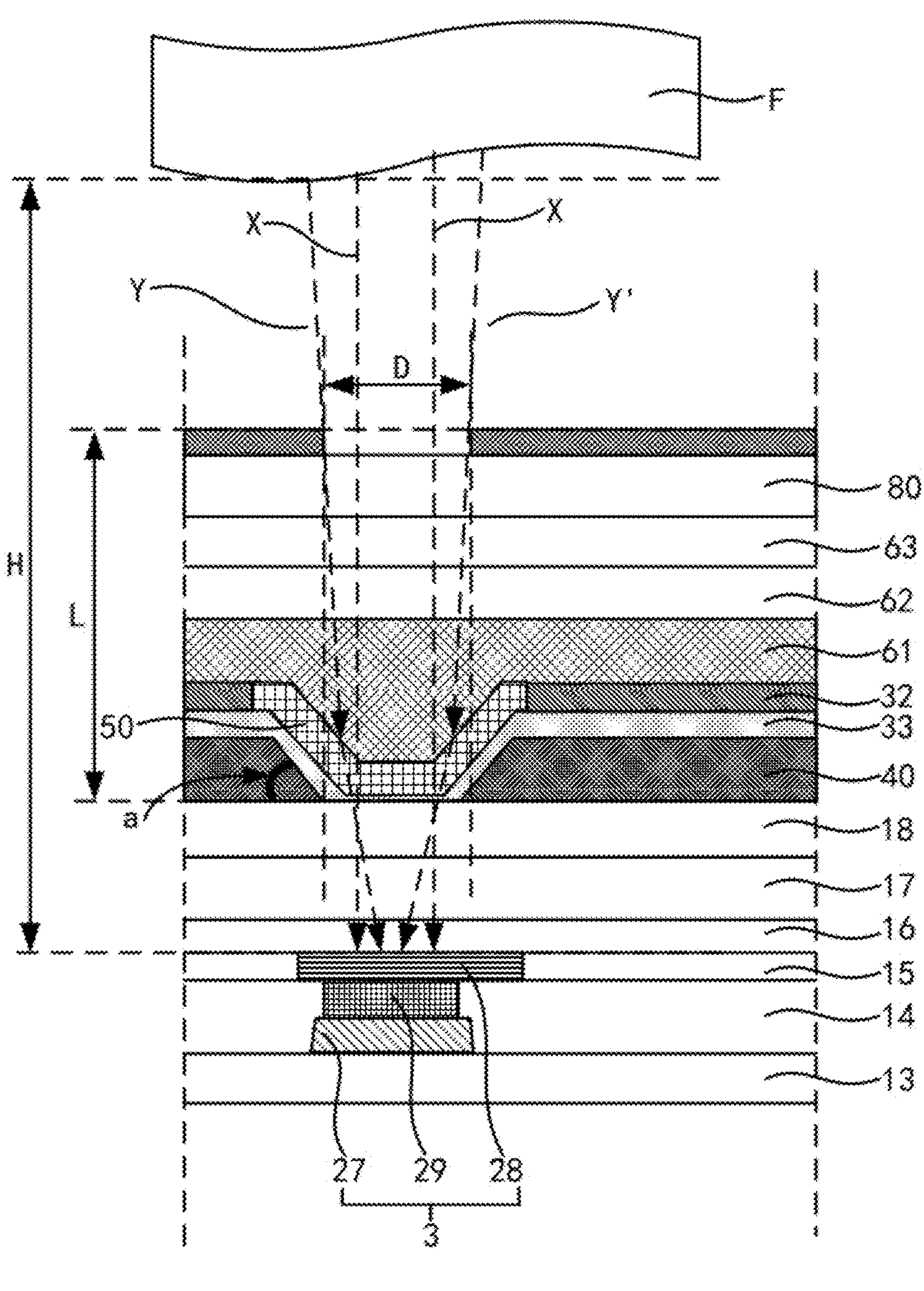
FIG. 5 is a schematic structural diagram of details of a second opening in FIG. 4.

In an embodiment, with reference to FIG. 1 to FIG. 5, FIG. 4 is a schematic diagram of another cross-sectional structure of a display panel (i.e., a display panel 101) according to an embodiment of the present disclosure, and FIG. 5 is a detailed schematic structural diagram of a second opening in FIG. 4. Different from the foregoing embodiment (i.e., the display panel 100), the display panel 101 further includes a color light filter layer 70 disposed on a side of the encapsulation layer 60 away from the substrate 10; and the color light filter layer 70 includes a light-shielding portion 71 and multiple light filter portions 72. The light-shielding portion 71 is provided with multiple fourth openings 711 corresponding to the multiple first openings 41 and multiple fifth openings 712 corresponding to the multiple second openings 42; and the multiple light filter portions 72 are disposed to correspond to the multiple fourth openings 711. The light-shielding portion 71 is made of opaque materials, such as a black matrix.

Alternatively, the multiple light filter portions 72 include multiple red color films, multiple green color films, and multiple blue color films; specially, the multiple red color films are disposed to correspond to the multiple red sub-pixels R, the multiple green color films are disposed to correspond to the multiple green sub-pixels G, and the multiple blue color films are disposed to correspond to the multiple blue sub-pixels B.

Alternatively, the orthographic projection of the second opening 42 on the substrate 10 and an orthographic projection of the corresponding fifth opening 712 on the substrate 10 have an overlapping area, and the orthographic projection of the corresponding light-sensing sensor 3 on the substrate 10 coincides with the overlapping area. Therefore, only lights passing through the overlapping area can reach the corresponding light-sensing sensor 3, and the lights passing through with greater angles can be absorbed by the pixel definition layer 40 near the corresponding second opening 42 and the light-shielding portion 71 near the corresponding fifth opening 712.

In this way, the pixel definition layer 40 and each of the multiple second openings 42 of the pixel definition layer 40 as well as the light-shielding portion 71 and each of the multiple fifth openings 712 of the light-shielding portion 71 are equivalent to a collimator; and the collimator can collimate the lights passing through the collimator and filter out the lights with greater angles, so that only collimated lights within a small range are emitted to the corresponding light-sensing sensor 3, thereby achieving a high signal-to-noise ratio and improving the recognition accuracy of the light-sensing sensor 3.

Alternatively, a shape of each of the plurality of second openings 42 is the same as a shape of each of the plurality of fifth openings 712, and a size of each of the plurality of second openings 42 is the same as a size of each of the plurality of fifth openings 712. Further, a shape of a bottom surface of each of the plurality of second openings 42 close to the substrate 10 is the same as a shape of a bottom surface of each of the plurality of fifth openings 712 close to the substrate 10, and a size of the bottom surface of the second opening 42 close to the substrate 10 is the same as a size of the bottom surface of the fifth opening 712 close to the substrate 10, namely, an orthographic projection of the bottom surface of the second opening 42 close to the substrate 10 on the substrate 10 is the same as an orthographic projection of the bottom surface of the fifth opening 712 close to the substrate 10 on the substrate 10, thereby to improve the collimation effect of the collimator on the emitted lights.

In an embodiment, an adjusting layer 80 is further disposed between the color light filter layer 70 and the encapsulation layer 60, and the adjusting layer 80 is configured to adjust a distance between the color light filter layer 70 and the encapsulation layer 60, and then to adjust a distance between the color light filter layer 70 and the pixel definition layer 40, thereafter to form the collimator with a preset height and to improve the collimation effect of the collimator on the emitted lights. Specially, the adjusting layer 80 is made of a transparent adhesive, such as photoresist (also referred to as OC adhesive).

Specifically, with reference to FIG. 5, in order to improve the collimation effect of the collimator to the emitted lights, parameters of the collimator needs to satisfy the following relationship:

$$\frac{L/2}{L/2+H}=\frac{D/2}{Z/2}.$$

Where, "L" in the above relationship represents the preset height of the collimator, "D" represents an aperture of the collimator, "Z" represents a fingerprint periodicity of the fingerprint F; the fingerprint periodicity refers to a sum of a distance between a ridge and a valley in the fingerprint; and "H" represents a distance from the fingerprint F to the corresponding light-sensing sensor 3.

When the lights are reflected by the fingerprint F to pass through the collimator, the lights substantially perpendicular to the receiving surface of the corresponding light-sensing sensor 3 can reach the light-sensing sensor 3 through making the parameters of the collimator satisfy the foregoing relationship; specially, the lights are illustrated by the lights X in FIG. 3; and other lights with greater angles are shielded by the light-shielding portion 71 and the pixel definition layer 40, so that the lights with greater angles can be filtered out and cannot be received by the light-sensing sensor 3. Therefore, each of the multiple light-sensing sensors 3 identifies the emitted lights in a small area, so that the higher signal-to-noise ratio is achieved and the recognition accuracy of the light-sensing sensor 3 is further improved.

It should be noted that the height of the collimator is a sum of a thickness of the light-shielding portion 71, a thickness of the adjusting layer 80, a thickness of the encapsulation layer 60, and a thickness of the pixel definition layer 40; namely, a distance between an upper surface of the light-shielding portion 71 and a lower surface of the pixel definition layer 40 is the height of the collimator, where the upper surface of the light-shielding portion 71 refers to the surface of the light-shielding portion 71 away from the encapsulation layer 60, and the lower surface of the pixel definition layer 40 refers to the surface of the pixel definition layer 40 away from the encapsulation layer 60. In addition, the aperture of the collimator refers to the size of the overlapping area formed by the second opening 42 and the fifth opening 712, that is, the size of the bottom surface of the second opening 42 close to the substrate 10. For example, when the overlapping area formed by the second opening 42 and the fifth opening 712 is a circle, the aperture of the collimator is also the diameter of the circle. The aperture of the collimator is less than a half of the fingerprint periodicity, for example, the aperture of the collimator is less than 200 micrometers, so that each of the multiple light-sensing sensors 3 only receives the very small range of lights, making the imaging of the fingerprint recognition more accurate and further improving the accuracy of the fingerprint recognition.

Further, when the lights filtered out by the collimator pass through the first inorganic encapsulation sublayer 61 to reach the interfaces between the first inorganic encapsulation sublayer 61 and the metal inhibition layer 50, the lights substantially perpendicular to the receiving surface of the corresponding light-sensing sensor 3 can reach the light-sensing sensor 3, such as the lights X in FIG. 5; and the lights at other angles are refracted by the metal inhibition layer 50, such as the lights Y and Y' in FIG. 5. Moreover, since the refractive index of the first inorganic encapsulation sublayer 61 is greater than the refractive index of the metal inhibition layer 50, the lights refracted by the metal inhibition layer 50 converge to the receiving surface of the light-sensing sensor 3, so as to increase the number of lights reaching the receiving surface of the light-sensing sensor 3, thereby improving the clarity of the formed optical fingerprint imaging and further improving the accuracy of the fingerprint recognition.

In the present embodiment (i.e., the display panel 101), by designing a structure of the multiple film layers on the display panel 101 to form the collimator, the lights reflected by the fingerprint F can pass through the collimator to reach the light-sensing sensor 3, thereby implementing the fingerprint recognition function of the display panel 101. Meanwhile, the collimator further has a light collimation function to filter out the lights with greater angels, thereby improving the signal-to-noise ratio of the light-sensing sensor 3, and further improving the recognition accuracy of the light-sensing sensor 3. The metal inhibition layer 50 with the lower refractive index is disposed in the second opening 42 and cooperates with the encapsulation layer 60 with the higher refractive index, so as to converge the lights filtered out by the collimator toward the receiving surface of the light-sensing sensor 3, and then increase the number of lights reaching the receiving surface of the light-sensing sensor 3 to improve the accuracy of the formed optical fingerprint imaging and the accuracy of the fingerprint recognition.

In addition, the display panel 101 of the present embodiment further differs from the display panel 100 in the foregoing embodiment that, with continued reference to FIG. 4, the driving circuit layer 20 further includes a second drain electrode 26; and the second drain electrode 26 is disposed on the first planarization layer 17 and is electrically connected to the first drain electrode 25 by a through hole of the first planarization layer 17. Moreover, a second planarization layer 18 is disposed to cover the second drain electrode 26 and the first planarization layer 17, and the corresponding first electrode 31 is disposed on the second planarization layer 18 and is electrically connected to the second drain electrode 26 by a through hole of the second planarization layer 18. Furthermore, the pixel definition layer 40 is disposed to cover the corresponding first electrode 31 and the second planarization layer 18.

By providing the second drain electrode 26, it is capable of satisfying a richer wiring requirement for the display panel 101; and the second drain electrode 26 is electrically connected to the first drain electrode 25, so that a contact impedance of the corresponding first electrode 31 can be reduced. In addition, by stacking the second planarization layer 18 on the first planarization layer 17, the undulation of the driving circuit layer 20 can be better planarized to form a planar surface, so as to facilitate forming the first electrode 31 with a flat surface. In addition, other specification of the present embodiment can refer to the foregoing embodiment, and details are not described herein again.

In an embodiment, with reference to FIG. 1 to FIG. 6, FIG. 6 is a schematic diagram of another cross-sectional structure of a display panel (i.e., a display panel 102) according to an embodiment of the present disclosure. Different from the foregoing embodiments, the display panel 102 further includes a touch layer disposed between the encapsulation layer 60 and the color light filter layer 70; the touch layer includes a touch electrode sublayer 91, the touch electrode sublayer 91 is provided with multiple sixth openings 911 at positions corresponding to the multiple light-sensing sensors 3, and the multiple sixth openings 911 are disposed to correspond to the multiple second openings 42. Moreover, the collimator further includes the touch electrode sublayer 91 and the corresponding sixth opening 911 thereof.

Specifically, the touch layer can be directly prepared on the encapsulation layer 60 through a direct on-cell touch solution (DOT), so as to achieve functions of better transmittance and bending resistance, and at the same time, the thickness of the display panel 102 can be effectively reduced, and the production cost is reduced. Alternatively, before preparing the touch layer on the encapsulation layer 60, a protective layer may be formed on the encapsulation layer 60 to protect the encapsulation layer 60.

Alternatively, the touch electrode sublayer 91 can include a driving electrode and a sensing electrode, so as to implement a touch function. Meanwhile, in order to reduce the resistance of the touch electrode sublayer 91, the touch electrode sublayer 91 can be made of an opaque metal, such as copper. However, the opaque touch electrode sublayer 91 shields the lights and affects light sensing of the corresponding light-sensing sensor 3, so that the touch electrode sublayer 91 is provided with the multiple sixth openings 911 at the positions corresponding to the multiple light-sensing sensors 3 to pass through the lights. An orthographic projection of each of the multiple sixth openings 911 on the substrate 10 at least covers the overlapping area formed by the corresponding second opening 42 and the corresponding fifth opening 712, so that the touch electrode sublayer 91 and the corresponding sixth opening 911 of the touch electrode sublayer 91 can also be constituted as a part of the collimator, thereby further improving the light collimation effect of the collimator.

In the embodiment, a shape of each of the multiple second openings 42 is the same as a shape of each of the multiple sixth openings 911, and a size of each of the multiple second openings 42 is smaller than or equal to a size of each of the multiple sixth openings 911. Further, the shape of the bottom surface of the second opening 42 close to the substrate 10 is the same as that of a bottom surface of each of the multiple sixth openings 911 close to the substrate 10, and the size of the bottom surface of the second opening 42 close to the substrate 10 is less than or equal to the size of the bottom surface of the sixth opening 911 close to the substrate 10. Namely, the orthographic projection of the bottom surface of the sixth opening 911 close to the substrate 10 on the substrate 10 is the same as the orthographic projection of the bottom surface of the second opening 42 on the substrate 10, so as to prevent the touch electrode sublayer 91 from blocking the second opening 42.

Alternatively, the orthographic projections of the second opening 42, the fifth opening 712, and the sixth opening 911 on the substrate 10 coincide, so that the size of each opening constituting the collimator can be minimized, thereby reducing the risk of light leakage of the collimator.

Figure 6:
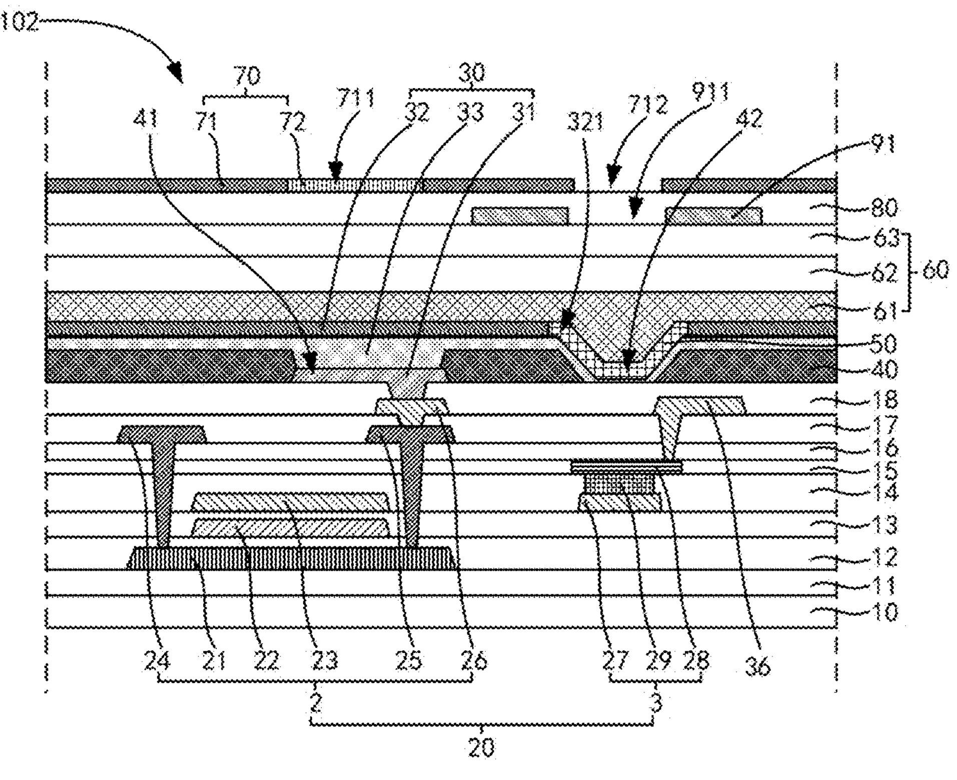
FIG. 6 is a schematic structural diagram of still another cross-sectional view of a display panel according to an embodiment of the present disclosure.

In addition, the display panel 102 of the present embodiment further differs from the display panel 101 in the foregoing embodiment that, with continued reference to FIG. 6, the display panel 102 further includes a first power cord 36, the first power cord 36 and the second drain electrode 26 are disposed at the same layer, and the first power cord 36 is electrically connected to an upper plate by the through hole of the first planarization layer 17 and is configured to provide a constant bias voltage for the light-sensing sensor 3. Moreover, other specification of the present embodiment can refer to the foregoing embodiments, and details are not described herein again.

In an embodiment, with reference to FIG. 1 to FIG. 7, FIG. 7 is a schematic diagram of a principle of total reflection at the interfaces between the metal inhibition layer and the encapsulation layer according to an embodiment of the present disclosure. When the lights filtered out by the collimator passes through the first inorganic encapsulation sublayer 61 to reach a first interface between the first inorganic encapsulation sublayer 61 and the metal inhibition layer 50, the lights are totally reflected on the first interface between the first inorganic encapsulation sublayer 61 and the metal inhibition layer 50, so that the lights emitted by the metal inhibition layer 50 deviates from the corresponding light-sensing sensor 3 to further filter out the lights with greater angles passing through the collimator, thereby further improving the signal-to-noise ratio of the light-sensing sensor 3 and improving the recognition accuracy.

Figure 7:
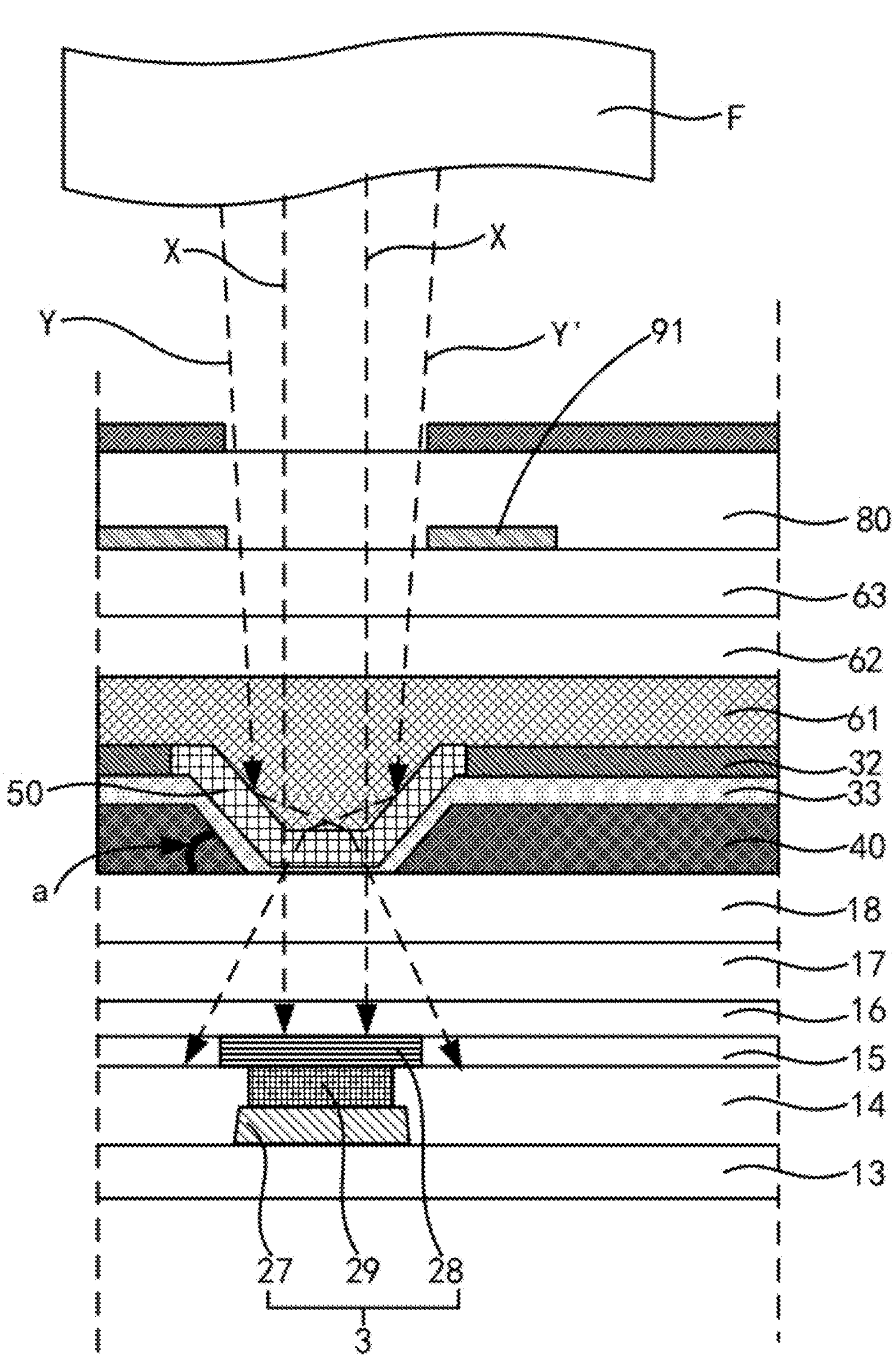
FIG. 7 is a schematic diagram of a principle of a total reflection at interfaces between a metal inhibition layer and a encapsulation layer according to an embodiment of the present disclosure.

Specifically, with reference to FIG. 7, after the lights reflected by the fingerprint F pass through the collimator, the lights passing through the collimator are substantially perpendicular to the receiving surface of the light-sensing sensor 3 due to the collimation effect of the collimator. However, some lights with greater angles inevitably exist in the lights substantially perpendicular to the receiving surface of the light-sensing sensor 3, such as the lights Y and Y' with the greater angles schematically shown in FIG. 7, and these lights Y and Y' with the greater angles also affect the signal-to-noise ratio of the light-sensing sensor 3.

Therefore, the encapsulation layer 60 with the higher refractive index and the metal inhibition layer 50 with the lower refractive index are provided on the position of collimator close to the light-sensing sensor 3 to filter out these lights with greater angles Y and Y'. Alternatively, in order to filter out the lights with greater angles Y and Y', the metal inhibition layer 50 with the preset slope is determined, so that these lights with greater angles Y and Y' are totally reflected when they are emitted to the first interface between the encapsulation layer 60 and the metal inhibition layer 50.

Specifically, by adjusting the shape of the second opening 42 of the pixel definition layer 40, a portion of the pixel definition layer 40 forming the second opening 42 has a slope, so that the metal inhibition layer 50 is disposed to cover the side wall of the second opening 42 to form the slope angle. Alternatively, a longitudinal cross-sectional shape of the second opening 42 can be an inverted trapezoidal shape, so that the second opening 42 has the slope angle a, and the slope angle a is greater than or equal to 55 degrees. In this way, the portion of the metal inhibition layer 50 covering the side wall of the second opening 42 also has a slope angle greater than or equal to 55 degrees, so as to achieve the total reflection when the lights Y and Y' with greater angles are emitted on the interface between the encapsulation layer 60 and the metal inhibition layer 50.

It should be noted that the slope angle a of the second opening 42 refers to the included angle between the side wall of the second opening 42 and the planarization layer covered by the pixel definition layer 40, and the side wall of the second opening 42 refers to the surface exposed by the second opening 42 after the pixel definition layer 40 forms the second opening 42. The slope angle of the metal inhibition layer 50 refers to an included angle between a portion of the metal inhibition layer 50 covering the side wall of the second opening 42 and the planarization layer covered by the pixel definition layer 40.

Further, with continued reference to FIG. 7, after the lights Y and Y' with greater angles are totally reflected on the first interface between the encapsulation layer 60 and the metal inhibition layer 50, and then the totally reflected lights are emitted to a second interface between the encapsulation layer 60 and the metal inhibition layer 50 again and are refracted at the second interface; and the refracted lights deviate from the light-sensing sensor 3, thereby filtering out the lights Y and Y' with greater angles, so as to further filter out the lights passing through the collimator and to further improve the signal-to-noise ratio and the recognition accuracy of the light-sensing sensor 3. The first interface and the second interface are two different surfaces of the metal inhibition layer 50, the first interface is formed by the metal inhibition layer 50 covering the side wall of the second opening 42, and the second interface is formed by the metal inhibition layer 50 covering the planarization layer below the pixel definition layer 40.

In this embodiment, the lights reflected by the fingerprint F can pass through the collimator to reach the light-sensing sensor 3, and the collimator further has a light collimation function to filter out the lights with greater angles, thereby improving the signal-to-noise ratio of the light-sensing sensor 3 and further improving the recognition accuracy of the light-sensing sensor 3. Moreover, the metal inhibition layer 50 with the lower refractive index is disposed in the second opening 42 and cooperates with the encapsulation layer 60 with the higher refractive index, so that the lights filtered out by the collimator passes through the first inorganic encapsulation sublayer 61 to achieve the total reflection at the first interface between the first inorganic encapsulation sublayer 61 and the metal inhibition layer 50, thereby making the lights emitted by the metal inhibition layer 50 deviate from the light-sensing sensor 3 to further filter out the lights with greater angles passing through the collimator. Therefore, the signal-to-noise ratio of the light-sensing sensor 3 is further improved, and the recognition accuracy is further improved.

Based on the same inventive concept, an embodiment of the present disclosure further provides an electronic device, which includes the display panel of any one of the foregoing embodiments. The electronic device can be determined as an electronic display product, such as a mobile phone, a tablet, a television, and a wearable device.

According to the foregoing embodiments, it can be seen that, in the display panel and the electronic device provided by the present disclosure, the driving circuit layer of the display panel includes the multiple pixel driving circuits and the multiple light-sensing sensors disposed between the adjacent pixel driving circuits; the multiple first electrodes are electrically connected to the multiple pixel driving circuits; the pixel definition layer is provided with the multiple first openings corresponding to the multiple first electrodes and the multiple second openings corresponding to the multiple light-sensing sensors; the metal inhibition layer is disposed to correspond to the multiple third openings and is laid in the multiple second openings; the encapsulation layer is disposed to cover the metal inhibition layer and fill into the multiple second openings; and the refractive index of the encapsulation layer is greater than that of the metal inhibition layer. In the present disclosure, the multiple second openings are formed on the pixel definition layer to make the lights pass through the pixel definition layer to reach the multiple light-sensing sensors, which solves the problem that the under-screen optical fingerprint is difficult to be directly applied in the OLED products in the related art. At the same time, the metal inhibition layer with the lower refractive index is disposed in the multiple second openings and then cooperates with the encapsulation layer with the higher refractive index, so as to converge the lights reflected by the fingerprint towards the receiving surfaces of the multiple light-sensing sensors, then to increase the number of lights reaching the receiving surfaces of the multiple light-sensing sensors, thereby improving the clarity of the formed optical fingerprint imaging and further improving the accuracy of the optical fingerprint recognition.

In the foregoing embodiments, the description of the various embodiments emphasized in different aspects, and some of the embodiments that are not described in detail can refer to the related descriptions of other embodiments.

The embodiments of the present disclosure are described in detail above and specific examples are used herein to describe the principles and implementation modes of the present disclosure. However, the description of the above embodiments is merely used to help understand the technical solutions of the present disclosure and the core idea thereof. It should be understood by those skilled in the related art that the technical solutions described in the foregoing embodiments may still be modified, or some of the technical features in the technical solutions may be equivalently substituted. But these modifications or substitutions do not make the essence of the corresponding technical solutions separate from the scope of the technical solutions of the embodiments of the present disclosure.

What is claimed is:

1. A display panel, comprising:

a substrate;

a driving circuit layer disposed on a side of the substrate and comprising both a plurality of pixel driving circuits and a light-sensing sensor disposed between adjacent pixel driving circuits of the plurality of pixel driving circuits;

a first electrode layer disposed on a side of the driving circuit layer away from the substrate and comprising a plurality of first electrodes, wherein each of the plurality of first electrodes is electrically connected to corresponding one of the plurality of pixel driving circuits;

a pixel definition layer disposed on a side of the first electrode layer away from the substrate and comprising both a plurality of first openings corresponding to the plurality of first electrodes and a plurality of second openings corresponding to a plurality of light-sensing sensors;

a light emitting layer disposed on a side of the pixel definition layer away from the substrate;

a second electrode layer disposed on a side of the light emitting layer away from the substrate and comprising a plurality of third openings corresponding to the plurality of second openings;

a metal inhibition layer corresponding to the plurality of third openings and laid in the plurality of second openings; and an encapsulation layer disposed on a side of the second electrode layer away from the substrate, wherein the encapsulation layer is disposed to cover the metal inhibition layer and fill into the plurality of second openings;

wherein a refractive index of the encapsulation layer is greater than that of the metal inhibition layer.

2. The display panel according to claim 1, wherein an included angle between a side wall of each of the plurality of second openings and a bottom surface of the second opening close to the substrate is greater than 90 degrees; and the metal inhibition layer is disposed to at least cover the side wall of each of the plurality of second openings.

3. The display panel according to claim 2, wherein the encapsulation layer comprises a first inorganic encapsulation sublayer, an organic encapsulation sublayer, and a second inorganic encapsulation sublayer stacked in sequence; and the first inorganic encapsulation sublayer is in contact with a side surface of the metal inhibition layer away from the substrate, and a refractive index of the first inorganic encapsulation sublayer is greater than that of the metal inhibition layer.

4. The display panel according to claim 1, further comprising:

a color light filter layer disposed on a side of the encapsulation layer away from the substrate, wherein the color light filter layer comprises:

a light-shielding portion, including a plurality of fourth openings corresponding to the plurality of first openings and a plurality of fifth openings corresponding to the plurality of second openings; and light filter portions corresponding to the plurality of fourth openings.

5. The display panel according to claim 4, wherein the pixel definition layer comprises black pixels, a shape of each of the plurality of second openings is the same as that of each of the plurality of fifth openings, and a size of each of the plurality of second openings is the same as that of each of the plurality of fifth openings.

6. The display panel according to claim 5, wherein a shape of a bottom surface of each of the plurality of second openings close to the substrate is the same as that of a bottom surface of each of the plurality of fifth openings close to the substrate, and a size of the bottom surface of the second opening close to the substrate is the same as a size of the bottom surface of the fifth opening close to the substrate.

7. The display panel according to claim 1, further comprising:

a touch layer disposed on a side of the encapsulation layer away from the substrate and comprising a touch electrode sublayer, wherein the touch electrode sublayer includes a plurality of sixth openings corresponding to the plurality of second openings.

8. The display panel according to claim 7, wherein a shape of each of the plurality of second openings is the same as that of each of the plurality of sixth openings, and a size of each of the plurality of second openings is smaller than or equal to that of each of the plurality of sixth openings.

9. The display panel according to claim 1, wherein a partial film layer of each of the plurality of light-sensing sensors is disposed at the same layer as that of the driving circuit layer.

10. The display panel according to claim 1, wherein each of the plurality of second openings has a slope angle greater than or equal to 55 degrees.

11. An electronic device, comprising a display panel, wherein the display panel comprises:

a substrate;

a driving circuit layer disposed on a side of the substrate and comprising both a plurality of pixel driving circuits and a light-sensing sensor disposed between adjacent pixel driving circuits of the plurality of pixel driving circuits;

a first electrode layer disposed on a side of the driving circuit layer away from the substrate and comprising a plurality of first electrodes, wherein each of the plurality of first electrodes is electrically connected to corresponding one of the plurality of pixel driving circuits;

a pixel definition layer disposed on a side of the first electrode layer away from the substrate and comprising both a plurality of first openings corresponding to the plurality of first electrodes and a plurality of second openings corresponding to a plurality of light-sensing sensors;

a light emitting layer disposed on a side of the pixel definition layer away from the substrate;

a second electrode layer disposed on a side of the light emitting layer away from the substrate and comprising a plurality of third openings corresponding to the plurality of second openings;

a metal inhibition layer corresponding to the plurality of third openings and laid in the plurality of second openings; and an encapsulation layer disposed on a side of the second electrode layer away from the substrate, wherein the encapsulation layer is disposed to cover the metal inhibition layer and fill into the plurality of second openings;

wherein a refractive index of the encapsulation layer is greater than that of the metal inhibition layer.

12. The electronic device according to claim 11, wherein an included angle between a side wall of each of the plurality of second openings and a bottom surface of the second opening close to the substrate is greater than 90 degrees; and the metal inhibition layer is disposed to at least cover the side wall of each of the plurality of second openings.

13. The electronic device according to claim 12, wherein the encapsulation layer comprises a first inorganic encapsulation sublayer, an organic encapsulation sublayer, and a second inorganic encapsulation sublayer stacked in sequence; and the first inorganic encapsulation sublayer is in contact with a side surface of the metal inhibition layer away from the substrate, and a refractive index of the first inorganic encapsulation sublayer is greater than that of the metal inhibition layer.

14. The electronic device according to claim 11, further comprising:

a color light filter layer disposed on a side of the encapsulation layer away from the substrate, wherein the color light filter layer comprises:

a light-shielding portion, including a plurality of fourth openings corresponding to the plurality of first openings and a plurality of fifth openings corresponding to the plurality of second openings; and light filter portions corresponding to the plurality of fourth openings.

15. The electronic device according to claim 14, wherein the pixel definition layer comprises black pixels, a shape of each of the plurality of second openings is the same as that of each of the plurality of fifth openings, and a size of each of the plurality of second openings is the same as that of each of the plurality of fifth openings.

16. The electronic device according to claim 15, wherein a shape of a bottom surface of each of the plurality of second openings close to the substrate is the same as that of a bottom surface of each of the plurality of fifth openings close to the substrate, and a size of the bottom surface of the second opening close to the substrate is the same as a size of the bottom surface of the fifth opening close to the substrate.

17. The electronic device according to claim 11, further comprising:

a touch layer disposed on a side of the encapsulation layer away from the substrate and comprising a touch electrode sublayer, wherein the touch electrode sublayer includes a plurality of sixth openings corresponding to the plurality of second openings.

18. The electronic device according to claim 17, wherein a shape of each of the plurality of second openings is the same as that of each of the plurality of sixth openings, and a size of each of the plurality of second openings is smaller than or equal to that of each of the plurality of sixth openings.

19. The electronic device according to claim 11, wherein a partial film layer of each of the plurality of light-sensing sensors is disposed at the same layer as that of the driving circuit layer.

20. The electronic device according to claim 11, wherein each of the plurality of second openings has a slope angle greater than or equal to 55 degrees.

* * * * *